United States Patent
Pan et al.

(10) Patent No.: US 12,041,745 B2
(45) Date of Patent: Jul. 16, 2024

(54) CASE ASSEMBLY FOR SERVER AND SERVER HAVING SAME

(71) Applicant: BITMAIN TECHNOLOGIES INC., Beijing (CN)

(72) Inventors: Jianjun Pan, Beijing (CN); Lei Zhang, Beijing (CN); Xudong Wang, Beijing (CN)

(73) Assignee: BITMAIN TECHNOLOGIES INC., Beijing (CN)

( * ) Notice: Subject to any disclaimer, the term of this patent is extended or adjusted under 35 U.S.C. 154(b) by 0 days.

(21) Appl. No.: 17/636,568

(22) PCT Filed: Aug. 22, 2019

(86) PCT No.: PCT/CN2019/101902
§ 371 (c)(1),
(2) Date: Feb. 18, 2022

(87) PCT Pub. No.: WO2021/031178
PCT Pub. Date: Feb. 25, 2021

(65) Prior Publication Data
US 2022/0304182 A1    Sep. 22, 2022

(51) Int. Cl.
*H05K 7/14*  (2006.01)
*G06F 1/18*  (2006.01)

(52) U.S. Cl.
CPC .......... *H05K 7/1489* (2013.01); *G06F 1/181* (2013.01)

(58) Field of Classification Search
CPC .. H05K 7/1489; H05K 5/0004; H05K 5/0021; H05K 5/0052; H05K 7/1488; H05K 7/18; H05K 7/1487; G06F 1/181
See application file for complete search history.

(56) References Cited

U.S. PATENT DOCUMENTS

| | | | |
|---|---|---|---|
| 8,842,437 B2 * | 9/2014 | Chang | G06F 1/20 361/704 |
| 2002/0080560 A1 * | 6/2002 | Flegeo | H05K 5/0004 361/600 |

(Continued)

FOREIGN PATENT DOCUMENTS

| CN | 203618243 U | 5/2014 |
|---|---|---|
| CN | 206226300 U | 6/2017 |

(Continued)

OTHER PUBLICATIONS

International Search Report and Written Opinion mailed May 27, 2020 in corresponding International Application No. PCT/CN2019/101902.

*Primary Examiner* — Anthony Q Edwards
*Assistant Examiner* — Hung Q Dang
(74) *Attorney, Agent, or Firm* — Jon E. Gordon; Haug Partners LLP

(57) ABSTRACT

The present application discloses a case assembly for a server and a server having same. The case assembly (100) is divided into a first case body (10) and a second case body (20) in a first direction, both a side of the first case body (10) that faces the second case body (20) and a side of the second case body (20) that faces the first case body (10) are open, and the first case body (10) and the second case body (20) are detachably connected and jointly define an accommodation space.

11 Claims, 5 Drawing Sheets

(56) References Cited

U.S. PATENT DOCUMENTS

| | | | | |
|---|---|---|---|---|
| 2009/0086422 A1* | 4/2009 | McClure | ............ | H05K 7/20727 |
| | | | | 361/679.48 |
| 2009/0267465 A1* | 10/2009 | Cheng | .................. | H05K 5/0004 |
| | | | | 312/223.2 |
| 2021/0159568 A1* | 5/2021 | Kim | .................... | H01M 50/258 |

FOREIGN PATENT DOCUMENTS

| CN | 206350276 U | 7/2017 |
|---|---|---|
| EP | 3407277 A1 | 11/2018 |

* cited by examiner

CASE ASSEMBLY FOR SERVER AND SERVER HAVING SAME

CROSS-REFERENCE TO RELATED APPLICATIONS

This application is the National Stage entry under 35 U.S.C. § 371 of International Application No. PCT/CN2019/101902, filed on Aug. 22, 2019, published on Feb. 25, 2021 under Publication Number WO 2021/031178 A1, the entirety of which is herein incorporated by reference.

TECHNICAL FIELD

The present application relates to the technical field of servers, and in particular to a case assembly for a server and a server having same.

BACKGROUND ART

In the related technical field of servers, most cases are of an integrated type and thus have large diagonal dimensions, which require a large-tonnage extrusion device for forming processing. However, such large-tonnage machine resources are rare, and device operating costs are high, easily causing many limitations in a daily production process. An extrusion die with a complicated structure is required in a machining process of an integrated-type case. Due to a large extrusion force, the die has a short service life. In addition, large dimensions and a large machining difficulty of the die result in high costs of the die. Due to process requirements, an integrated-type case needs to have a relatively large wall thickness, and costs of a material of the case are relatively high. The case is relatively heavy, which causes trouble to subsequent transportation and carrying of the case.

SUMMARY OF THE INVENTION

The present application is intended to solve at least one of the technical problems existing in the prior art. To this end, the present application proposes a case assembly for a server. The case assembly is formed by combining a first case body and a second case body that are arranged in a split manner, and dimensions of the first case body and the second case body are relatively small. Requirements on an extrusion device are not high, and processing costs for a die are low.

The present application further proposes a server having the foregoing case assembly.

A case assembly for a server according to an embodiment of a first aspect of the present application, where in a first direction, a second direction, and a third direction that are perpendicular to each other, a dimension of the case assembly in the first direction is greater than a dimension of the case assembly in the second direction and greater than a dimension of the case assembly in the third direction; and the case assembly is divided into a first case body and a second case body in the first direction, both a side of the first case body that faces the second case body and a side of the second case body that faces the first case body are open, and the first case body and the second case body are detachably connected and jointly define an accommodation space.

According to the case assembly for a server in this embodiment of the present application, the dimension of the case assembly in the first direction is the largest, and the first case body and the second case body that are arranged in a split manner are used, so as to reduce dimensions of the first case body and the second case body in the first direction, thereby reducing limitations of the dimensions of the case assembly on a production device, and reducing a difficulty and production costs of a machining process of the case assembly. In addition, the first case body and the second case body have relatively small dimensions and have relatively low requirements on wall thicknesses. Reducing the wall thicknesses of the first case body and the second case body can reduce materials required for the production of the case assembly, further reduce the production costs of the case assembly, and reduce the weight of the case assembly, making it convenient to use and transport the case assembly.

In addition, the case assembly for a server according to this embodiment of the present application may have the following additional technical features:

According to some embodiments of the present application, the dimension of the case assembly in the second direction is greater than the dimension of the case in the third direction, one of the first case body and the second case body has a sliding rail extending in the second direction, and the other of the first case body and the second case body is provided with a sliding groove that cooperates with the sliding rail.

According to some embodiments of the present application, the sliding rail includes: a connecting portion and a limiting portion, where one side of the connecting portion is connected to the one of the first case body and the second case body and extends in the second direction, and the limiting portion is connected to the other side of the connecting portion and extends in the second direction, with a maximum width of the limiting portion in the third direction greater than a maximum width of the connecting portion in the third direction.

According to some embodiments of the present application, a cross section of the limiting portion is formed with a shape of a circle, an ellipse, or a polygon.

According to some embodiments of the present application, an edge of the first case body that is adjacent to the second case body is formed with a first reinforcing portion, the first reinforcing portion is located on an outer surface of a side wall of the first case body in the third direction, a thickness of the first reinforcing portion is greater than a wall thickness of the first case body, one of the sliding rail and the sliding groove is provided on the first reinforcing portion, and the first reinforcing portion protrudes from the outer surface of the first case body; and an edge of the second case body that is adjacent to the first case body is formed with a second reinforcing portion, the second reinforcing portion is located on an outer surface of a side wall of the second case body in the third direction, a thickness of the second reinforcing portion is greater than a wall thickness of the second case body, the other of the sliding rail and the sliding groove is provided on the second reinforcing portion, and the second reinforcing portion protrudes from the outer surface of the second case body.

According to some embodiments of the present application, a server case includes at least one limiting member, where a length of the sliding rail is less than a length of the sliding groove, and the limiting member is inserted into an end portion of the sliding groove and abuts against an end face of the sliding rail.

According to some embodiments of the present application, the end portion of the sliding groove is provided with internal threads, and the limiting member is provided with external threads that cooperate with the internal threads.

According to some embodiments of the present application, a diagonal length of a section of the first case body that is perpendicular to the second direction is L1, a diagonal length of a section of the second case body that is perpendicular to the second direction is L2, L1<280 mm, and L2<280 mm.

According to some embodiments of the present application, L1<220 mm and L2<220 mm.

According to some embodiments of the present application, each of the first case body and the second case body includes: a bottom plate and two side plates, where the two side plates are connected to edges on two sides of the bottom plate in a one-to-one correspondence, the side plates are arranged perpendicular to the bottom plate, and the two side plates cooperate with the bottom plate to define a part of the accommodation space.

According to some embodiments of the present application, the case assembly further includes: at least one end plate, where one end plate seals one side of the accommodation space in the second direction, or two end plates respectively seals two sides of the accommodation space in the second direction, and the end plates are connected to the first case body and the second case body.

According to some embodiments of the present application, the periphery of the end plate is formed with bent edges that bend toward the first case body and the second case body, one part of the bent edges abuts against an outer wall surface of the first case body, and the other part of the bent edges abuts against an outer wall surface of the second case body.

According to some embodiments of the present application, at least one of the first case body and the second case body is configured to be obtained by tearing off a supporting partition from a transitional case body, the supporting partition is connected between the two side plates and is arranged in parallel with the bottom plate, a thickness of a part of the supporting partition that is adjacent to either of the side plates is less than a thickness of the other part of the supporting partition, and the transitional case body is configured to be integrally extruded by an extrusion device.

According to some embodiments of the present application, the thickness of the part of the supporting partition that is adjacent to the partition is t1, 0.6 mm≤t1≤1 mm, a thickness of either of the side walls of the first case body is t2, 2.3 mm≤t2≤2.7 mm, a thickness of either of the side walls of the second case body is t3, and 2.3 mm≤t3≤2.7 mm.

A server according to an embodiment of a second aspect of the present application includes the case assembly for a server according to the foregoing embodiment and a hash board, where the hash board is arranged in the accommodation space, and at least two hash chips connected in series are arranged on the hash board.

BRIEF DESCRIPTION OF THE DRAWINGS

The above and/or additional aspects and advantages of this application will become apparent and easily comprehensible from the following description of embodiments in conjunction with the accompanying drawings, in which.

REFERENCE NUMERALS

Figure 1:
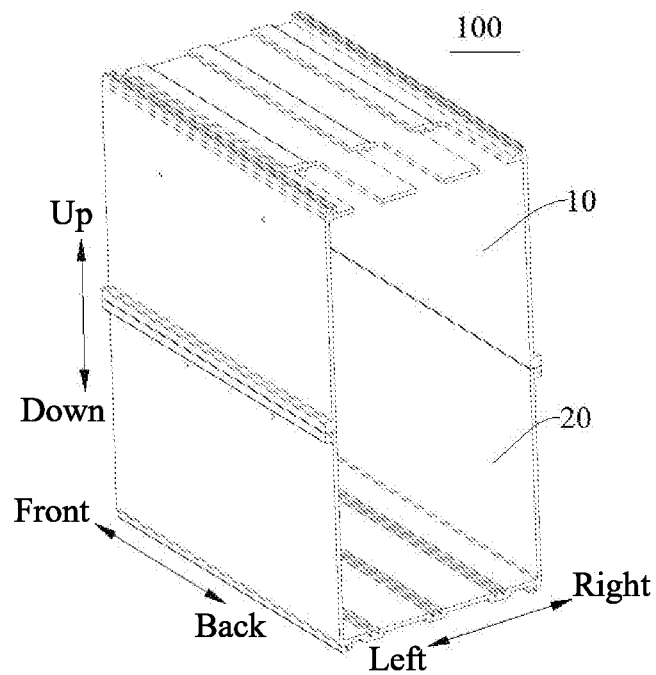
FIG. 1 is a schematic structural diagram of a case assembly according to an embodiment of the present application.

S: Server;
100: Case assembly;
10: First case body;
11: First side plate; 12: Second side plate; 13: Bottom plate;
14: Sliding rail; 141: Connecting portion; 142: Limiting portion;
15: First reinforcing portion; 16: Limiting member;
20: Second case body; 21: Second reinforcing portion; 22: Sliding groove;
30: End plate; and
200: Fan assembly.

DETAILED DESCRIPTION OF EMBODIMENTS

Embodiments of the present application will be described in detail below. Examples of the embodiments are shown in the accompanying drawings, and throughout the drawings, the same or similar reference numerals refer to the same or similar elements or elements having the same or similar functions. The embodiments described below with reference to the accompanying drawings are exemplary and are intended to be illustrative of the present application, but should not be construed as limiting the present application.

Hereinafter, a case assembly 100 for a server according to an embodiment of the present application is described with reference to FIGS. 1 to 9.

As shown in FIG. 1, the case assembly 100 for a server according to this embodiment of the present application includes a first case body 10 and a second case body 20 that are arranged in a split manner.

In a first direction, a second direction, and a third direction that are perpendicular to each other, a dimension of the case assembly 100 in the first direction is greater than a dimension of the case assembly 100 in the second direction and greater than a dimension of the case assembly 100 in the third direction. The first case body 10 and the second case body 20 are detachably connected in the first direction. Both a side of the first case body that faces the second case body and a side of the second case body that faces the first case body are open, and the first case body and the second case body are detachably connected and jointly define an accommodation space.

Specifically, the first case body 10 is open on one side in the first direction, and the second case body 20 is open on the other side in the first direction. In other words, the first case body 10 defines a first accommodation space that opens toward the second case body 20 in the first direction, and the second case body 20 defines a second accommodation space that opens toward the first case body 10 in the first direction. The first case body 10 may be provided with a first connecting mechanism, and the second case body 20 may be provided with a second connecting mechanism. The first connecting mechanism and the second connecting mechanism are adapted to be connected such that the first case body 10 and the second case body 20 are detachably connected. When the first case body 10 and the second case body 20 are connected, the first accommodation space and the second accommodation space are in communication to form a complete accommodation space.

The dimension of the case assembly 100 in the first direction (an up/down direction shown in FIG. 1) is greater than the dimensions of the first direction in the second direction (a front/back direction shown in FIG. 1) and the third direction (a left/right direction shown in FIG. 1) perpendicular to the first direction. The second direction is arranged perpendicular to the third direction. For example, the first direction may be a height direction of the case assembly 100, the second direction may be a length direction of the case assembly 100, the third direction may be a width direction of the case assembly 100, and the height direction of the case assembly 100 is greater than the length direction and the width direction of the case assembly 100.

For a case assembly for a server in the related art, a section of an integrated-type case structure has a relatively large diagonal dimension in a plane formed by the first direction and the third direction. Accordingly, high requirements are imposed on a processing device for the case structure with a relatively large diagonal, devices are insufficient, and processing costs are high. In addition, to ensure stability of the case structure, the case with a relatively large diagonal dimension requires a corresponding increased wall thickness of the case, which not only increases production costs, but also increases a weight of a case assembly, causing much inconvenience to users in moving and transporting the case.

Therefore, according to the case assembly 100 for a server according to the present application, the dimension of the case assembly 100 in the first direction is the largest, and the first case body 10 and the second case body 20 that are arranged in a split manner are used, so as to reduce dimensions of the first case body 10 and the second case body 20 in the first direction, thereby reducing limitations of the dimensions of the case assembly 100 on a production device, and reducing a difficulty and production costs of a machining process of the case assembly 100. In addition, the first case body 10 and the second case body 20 have relatively small dimensions and have relatively low requirements on wall thickness. Reducing the wall thicknesses of the first case body 10 and the second case body 20 can reduce materials required for the production of the case assembly 100, further reduce the production costs of the case assembly 100, and reduce the weight of the case assembly 100, making it convenient to use and transport the case assembly 100.

Hereinafter, the case assembly 100 for a server according to this embodiment of the present application is described in detail with reference to the accompanying drawings.

Figure 2:
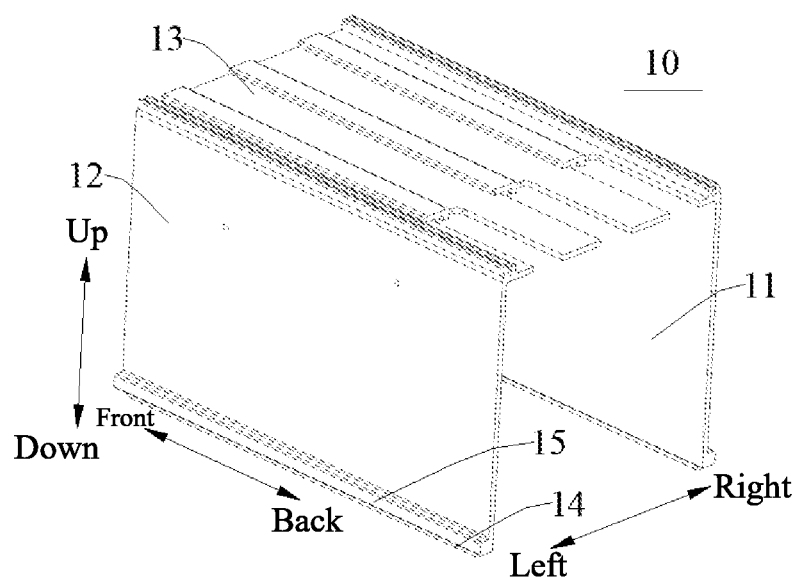
FIG. 2 is a schematic structural diagram of a first case body according to an embodiment of the present application.
Figure 3:
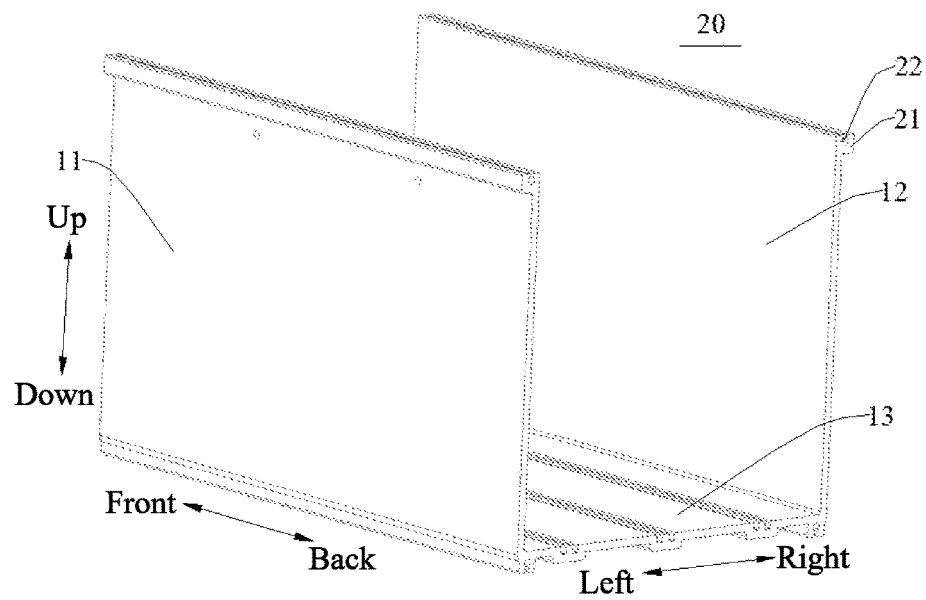
FIG. 3 is a schematic structural diagram of a second case body according to an embodiment of the present application.

As shown in FIGS. 2 and 3, according to some embodiments of the present application, the dimension of the case assembly 100 in the second direction is greater than the dimension of the case assembly 100 in the third direction. One of the first case body 10 and the second case body 20 has a sliding rail 14 extending in the second direction (the front/back direction shown in FIG. 1), and the other of the first case body 10 and the second case body 20 is provided with a sliding groove 22 that cooperates with the sliding rail 14. One of the sliding rail 14 and the sliding groove 22 may be provided on a surface of the first case body 10 that faces the second case body 20, and the other of the sliding rail 14 and the sliding groove 22 may be provided on a surface of the second case body 20 that faces the first case body 10. The sliding rail 14 adapts to the sliding groove 22 and extends in the second direction, and the first case body 10 and the second case body 20 are connected through a clamping fit between the sliding rail 14 and the sliding groove 22.

The first case body 10 and the second case body 20 are connected through a clamping fit between the sliding rail 14 and the sliding groove 22. The structure is simple and the operation is easy. It can not only improve the stability of the connection between the first case body 10 and the second case body 20, but also improve the assembly efficiency and maintenance efficiency of the case assembly 100 due to a low operation difficulty of the sliding and clamping fit process of the sliding rail 14 and the sliding groove 22. The dimension of the case assembly 100 in the second direction is greater than its dimension in the third direction, which can increase a fitting length of the sliding rail 14 and the sliding groove 22, and thus can further improve the fitting stability of the first case body 10 and the second case body 20.

There are two sliding rails 14 and two sliding grooves 22, and the two sliding rails 14 fit into the two sliding grooves 22 in a one-to-one correspondence, so that the connection stability between the first case body 10 and the second case body 20 can be improved, and it can be ensured that acting forces between the first case body 10 and the second case body 20 are evenly distributed, which prevents the first case body 10 and the second case body 20 from being damaged due to uneven forces.

According to some embodiments of the present application, one sliding rail 14 and one sliding groove 22 may be provided on the first case body 10, and one sliding rail 14 and one sliding groove 22 may be provided on the second case body 20. The sliding rail 14 of the first case body 10 fits the sliding groove 22 of the second case body 20, and the sliding groove 22 of the first case body 10 fits the sliding rail 14 of the second case body 20.

Figure 4:
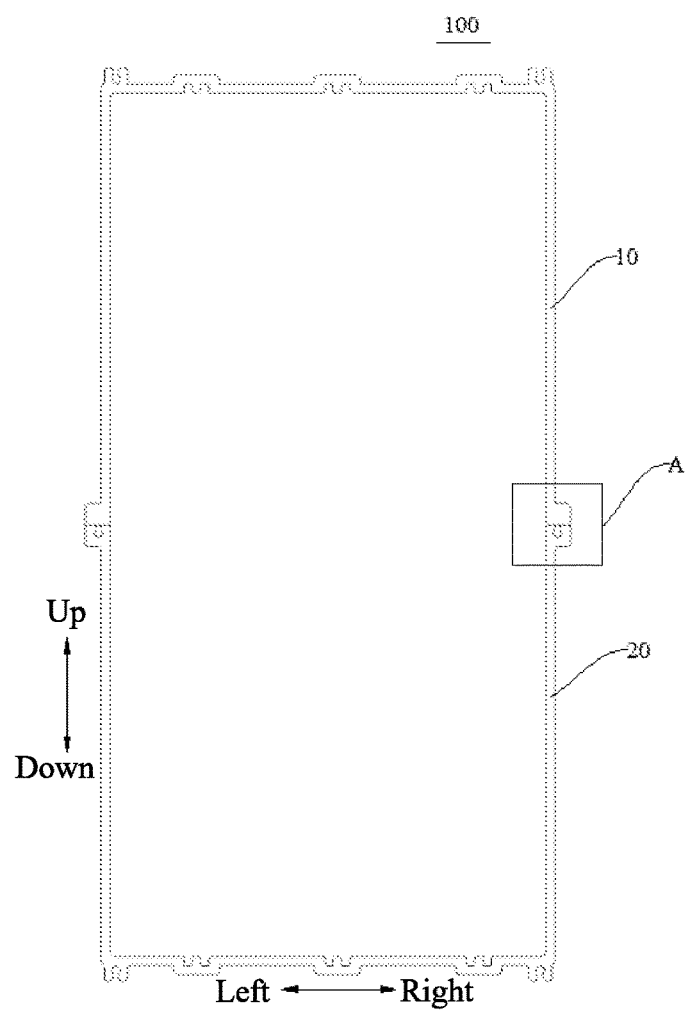
FIG. 4 is a front view of a case assembly according to an embodiment of the present application.
Figure 5:
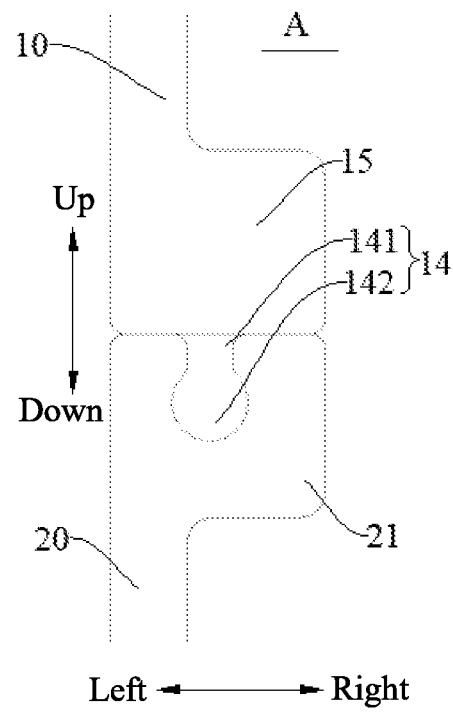
FIG. 5 is an enlarged view of A in FIG. 4.

As shown in FIGS. 4 and 5, according to some embodiments of the present application, the sliding rail 14 includes: a connecting portion 141 and a limiting portion 142, where one side of the connecting portion 141 may be connected to the one of the first case body 10 and the second case body 20 and extends in the second direction, and the limiting portion 142 is connected to the other side of the connecting portion 141 and extends in the second direction.

A maximum width of the limiting portion 142 in the third direction is greater than a maximum width of the connecting portion 141 in the third direction. The sliding rail 14 and the sliding groove 22 fit each other, and a shape of a section of the sliding groove 22 in the third direction is the same as that of the sliding rail 14 in the third direction. In the third direction, the maximum dimension of the limiting portion 142 is greater than a dimension of the connecting portion 141, that is, the dimension of the limiting portion 142 is greater than a dimension of an opening of the sliding groove 22, thereby preventing the sliding rail 14 from sliding off the opening of the sliding groove 22.

As shown in FIG. 5, according to some embodiments of the present application, a section of the limiting portion 142 is formed with a shape of a circle, an ellipse, or a polygon, and the shape of the section of the limiting portion 142 may be flush with the center of the shape of the section of the connecting portion 141. The limiting portion 142 with the foregoing shape of the section is arranged, which has a simple structure, is easily machined and formed, and is not prone to stress concentration.

As shown in FIG. 5, according to some embodiments of the present application, an edge of the first case body 10 that is adjacent to the second case body 20 is formed with a first reinforcing portion 15. A dimension of the first reinforcing portion 15 in the second direction is equal to a dimension of the first case body 10 in the second direction, and the first reinforcing portion 15 is in a long strip shape. The first reinforcing portion 15 is located on an outer surface of a side wall of the first case body 10 in the third direction, and a dimension of the first reinforcing portion 15 in the third direction is greater than a thickness of the first case body 10. An edge of the second case body 20 that is adjacent to the first case body 10 is formed with a second reinforcing portion 21. A dimension of the second reinforcing portion 21 in the second direction is equal to a dimension of the second case body 20 in the second direction, and the second reinforcing portion 21 is in a long strip shape. The second reinforcing portion 21 is located on an outer surface of a side wall of the second case body 20 in the third direction, and a dimension of the second reinforcing portion 21 in the third direction is greater than a thickness of the second case body 20.

The sliding rail 14 and the sliding groove 22 are provided on the first case body 10 or the second case body 20. Because thicknesses of the first reinforcing portion 15 and the second reinforcing portion 21 are large, a bearing capacity and stability are high, and the structural and functional stability of the sliding rail 14 and the sliding groove 22 can be improved, to prevent the sliding rail 14 and the sliding groove 22 from being separated due to deformation of the sliding rail 14 and the sliding groove 22.

Further, the first reinforcing portion 15 protrudes from the outer surface of the first case body 10, and the second reinforcing portion 21 protrudes from the outer surface of the second case body 20, that is, a surface of the first reinforcing portion 15 that faces the first accommodation space is flush with an inner peripheral wall of the first case body 10, a surface of the first reinforcing portion 15 that is away from the first accommodation space protrudes from an outer peripheral wall of the first case body 10, a surface of the second reinforcing portion 21 that faces the second accommodation space is flush with an inner peripheral wall of the second case body 20, and a surface of the second reinforcing portion 21 that is away from the second accommodation space protrudes from an outer peripheral wall of the second case body 20. The outward protrusion of the first reinforcing portion 15 and the second reinforcing portion 21 can prevent the first reinforcing portion 15 and the second reinforcing portion 21 from occupying an internal space of the accommodation space, which helps increase a volume of the accommodation space, and can also prevent parts of a server S from colliding with the first reinforcing portion 15 or the second reinforcing portion 21 in an assembly process, thereby facilitates the assembly of the server S.

Figure 6:
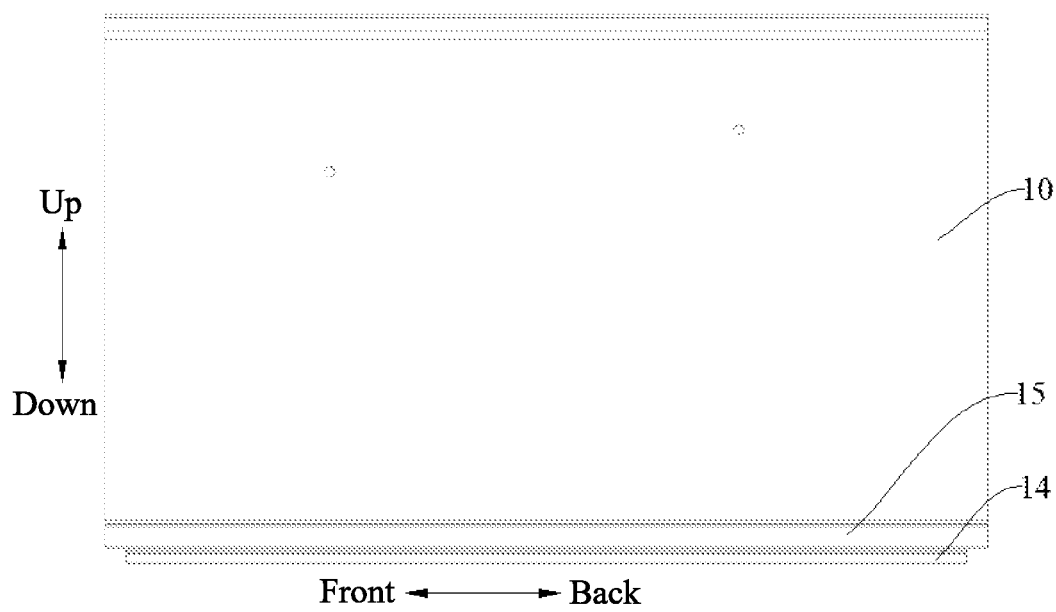
FIG. 6 is a schematic structural diagram of a first case body according to another embodiment of the present application.
Figure 7:
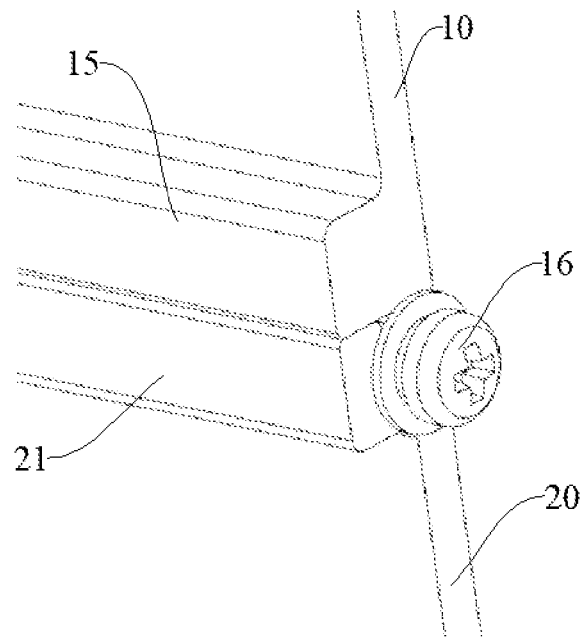
FIG. 7 is a schematic diagram of fitting between a first case body and a second case according to an embodiment of the present utility.
Figure 8:
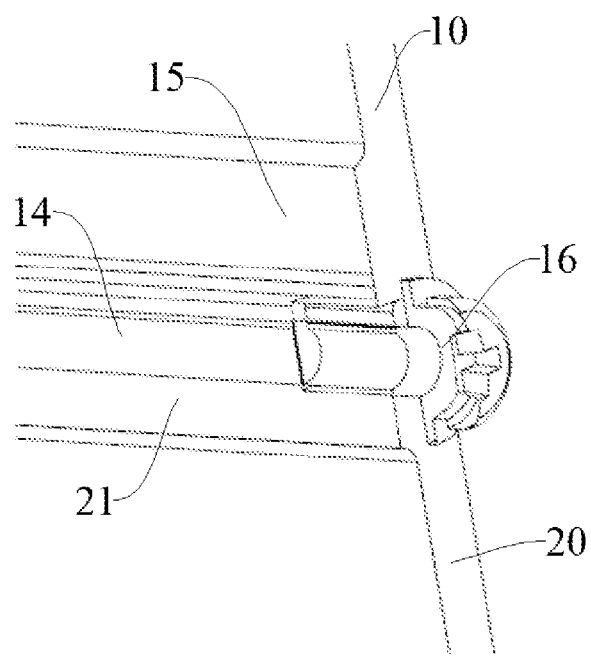
FIG. 8 is a sectional view of the structure in FIG. 7.

As shown in FIGS. 6, 7, and 8, the case assembly 100 according to this embodiment of the present application further includes: at least one limiting member 16. A length of the sliding rail 14 is less than a length of the sliding groove 22, and when the sliding rail 14 fits into the sliding groove 22, two ends of the sliding rail 14 may be spaced apart from two ends of the sliding groove 22. The limiting member 16 is inserted into an end portion of the sliding groove 22 and abuts against an end face of the sliding rail 14.

The end portion of the sliding groove 22 is provided with internal threads, and the limiting member 16 is provided with external threads that cooperate with the internal threads. For example, the limiting member 16 may be a screw or a bolt, a position on the inner surface of the sliding groove 22 that is near the end portion is formed with internal threads, the sliding rail 14 slides into the sliding groove 22, the limiting member 16 is screwed on the internal threads of the sliding groove 22, and an end of the limiting member 16 extending into the sliding groove 22 abuts against the end face of the sliding rail 14 that faces the limiting member 16. There may be two limiting members 16. Both ends of the sliding groove 22 are provided with internal threads so that the sliding rail 14 abuts between the limiting members 16 on both ends of the sliding groove 22 to prevent the sliding rail 14 from being in the sliding groove 22, to improve the fitting stability of a split case.

In this embodiment, a diagonal length of a section of the first case body 10 in a plane formed by the first direction and the third direction is L1, and L1<280 mm. Further, L1<220 mm, and L1 may be 210 mm, 200 mm, 190 mm, 185 mm, etc.

Similarly, a diagonal length of a section of the first case body 10 in a plane formed by the first direction and the third direction is L2, and L2<280 mm. Further, L2<220 mm, and L2 may be 210 mm, 200 mm, 190 mm, 185 mm, etc.

A value of L1 is used to define dimensions of the first case body 10, and a value of L2 is used to define dimensions of the second case body 20, to prevent the first case body 10 and the second case body 20 from being too large and increasing the difficulty of a production process, and reduce the production costs of the case assembly 100.

As shown in FIGS. 2 and 3, according to some embodiments of the present application, each of the first case body 10 and the second case body 20 includes: a bottom plate 13 and two side plates, where the two side plates are connected to edges on two sides of the bottom plate 13 in a one-to-one correspondence, the side plates are arranged perpendicular to the bottom plate 13, and the two side plates cooperate with the bottom plate 13 to define a part of the accommodation space.

Sections of the first case body 10 and the second case body 20 are both U-shaped. A U shape formed by the section of the first case body 10 opens toward the second case body 20, and a U shape formed by the section of the second case body 20 opens toward the first case body 10. In the first case body 10 and the second case body 20, the two side plates are the first side plate 11 and the second side plate 12, respectively. The first side plate 11 and the second side plate 12 are equal in size and similar in shape. One side of the first side plate 11 in the first direction coincides with one side of the bottom plate 13 in the third direction. One side of the second side plate 12 in the first direction coincides with the other side of the bottom plate 13 in the third direction. The first side plate 11 and the second side plate 12 are arranged in parallel, and the bottom plate 13, the first side plate 11, and the second side plate 12 each may be a rectangular structure.

The sliding rail 14 and the sliding groove 22 are both provided on a surface of the side plate that is away from the bottom plate 13. When the first case body 10 and the second case body 20 are connected, one side of the side plate of the first case body 10 that is away from the bottom plate 13 is connected to one side of the side plate of the second case body 20 that is away from the bottom plate 13. The first case body 10 and the second case body 20 are combined to form a case assembly 100 with a section of a rectangular shape. The case assembly 100 is formed as a cubic frame structure, with the front and back of the case assembly 100 open. Parts are mounted through the front and back openings in a server assembly process, which makes assembly convenient and efficient.

The case assembly 100 according to this embodiment of the present application further includes: at least one end plate 30, where the at least one end plate 30 seals at least one side of the accommodation space in the second direction, and the end plate 30 is connected to the first case body 10 and the second case body 20. In the second direction, two sides of the case assembly 100 are open, and the end plate 30 is connected to the first case body 10 and the second case body 20 and seals an open side of the case assembly 100. There may be one end plate 30, which seals the front side or the back side of the case assembly 100; or there may be two end plates 30, which seal the two sides of the case assembly 100.

The end plate 30 is located in a plane formed in the first direction and the third direction. One end of the end plate 30 is connected to the first case body 10, and the other end is connected to the second case body 20. A connection manner may be fastening the end plate 30 onto the corresponding first case body 10 or second case body 20 by using a screw or a bolt, and the end plate 30 is perpendicular to a plane in which the sliding rail 14 and the sliding groove 22 are located.

The first case body 10 and the second case body 20 are U-shaped structures, the combined case assembly 100 is a frame structure, and the accommodation space has at least two open sides. In this case, one or two end plates 30 may be used to seal the open sides of the accommodation space. Providing the end plate 30 can not only seal the accommodation space, but can also avoid relative sliding of the sliding rail 14 and the sliding groove 22 in the second direction, preventing an internal structure of the server S from being damaged. The limiting member 16 screwed into the sliding groove 22 may be screwed into the sliding groove 22 through the end plate 30, which can not only enhance a function of limiting the sliding rail 14, but can also have a function of fastening the end plate 30.

Figure 9:
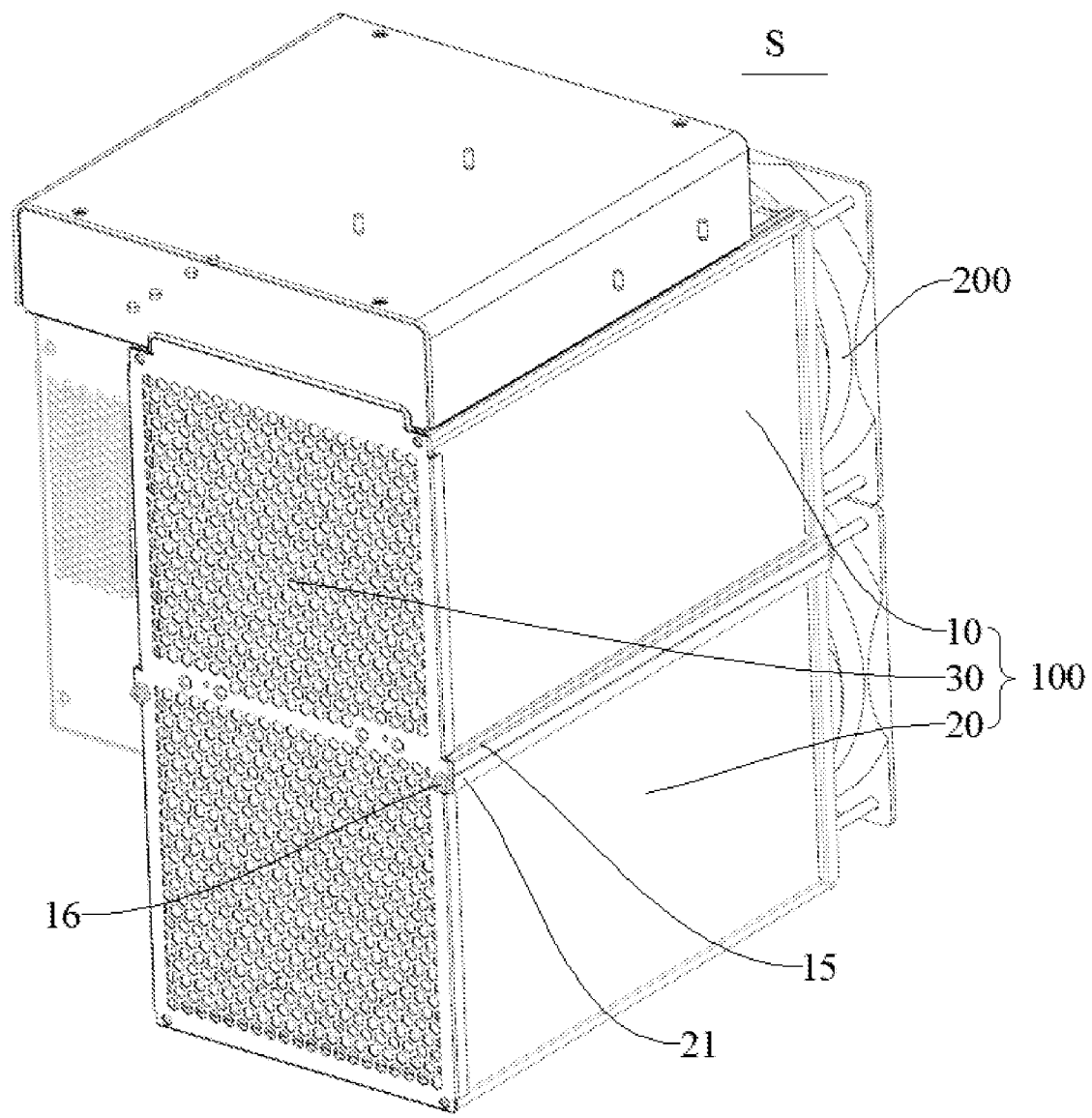
FIG. 9 is a schematic diagram of a mechanism of a server according to an embodiment of the present application.

According to the case assembly 100 in this embodiment of the present application, as shown in FIG. 9, the periphery of the end plate 30 is formed with bent edges that bend toward the first case body 10 and the second case body 20. A dimension of the end plate 30 in the second direction is greater than dimensions of the first case body 10 and the second case body 20 in the second direction, and a dimension of the end plate 30 in the third direction is greater than dimensions of the first case body 10 and the second case body 20 in the third direction. One part of the bent edges abuts against an outer wall surface of the first case body 10, and the other part of the bent edges abuts against an outer wall surface of the second case body 20. The end plate 30 has two bent edges in the third direction, and a distance between the two bent edges in the third direction is slightly greater than a distance between an outer wall surface of the first side plate 11 and an outer wall surface of the second side plate 12.

This can prevent internal parts of the server from falling into the outside of the case assembly 100. In addition, since the case assembly 100 is generally a frame structure, providing the bent edges can prevent the end plate 30 from sliding into the accommodation space under force, thereby further improving the stability of the case assembly 100, and can also make edges and corners of the case assembly 100 smooth, preventing the edges and corners from hurting users.

According to some embodiments of the present application, at least one of the first case body 10 and the second case body 20 is configured to be obtained by tearing off a supporting partition from a transitional case body, and the supporting partition is connected between the two side plates and is arranged in parallel with the bottom plate 13. The transitional case body is configured to be integrally extruded by an extrusion device.

Since the first case body 10 and the second case body 20 are both U-shaped structures, there is a relatively large distance between the first side plate 11 and the second side plate 12. In a machining process, the two side plates are prone to deformation in a direction away from the bottom plate 13. The first case body 10 and the second case body 20 after the deformation are not conducive to the transportation and assembly of the case assembly 100, and the overall strength of the first case body 10 and the second case body 20 may also be affected. With the transitional case body, the supporting partition on the transitional case body is used to define the distance between the two side plates, which prevents the first case body 10 and the second case body 20 from deforming in a machining process, and can also improve the safety and stability of the transitional case body during transportation. In addition, the supporting partition is parallel to the bottom plate 13 and does not affect machining of a split case.

According to some embodiments of the present application, a thickness of a part of the supporting partition that is adjacent to either of the side plates is less than a thickness of the other part of the supporting partition, the thickness of the part of the supporting partition that is adjacent to the partition is t1, $0.6\ mm \leq t1 \leq 1\ mm$, a thickness of either of the side walls of the first case body 10 is t2, $2.3\ mm \leq t2 \leq 2.7\ mm$, a thickness of either of the side walls of the second case body 20 is t3, and $2.3\ mm \leq t3 \leq 2.7\ mm$. In the server assembly process, the supporting partition on the first case body 10 and the second case body 20 needs to be removed. Reducing a distance between the supporting partition and the side plate makes it convenient for working personnel to remove the supporting partition.

The assembly of the case assembly 100 according to this embodiment of the present application is described below with reference to specific embodiments.

As shown in FIG. 4, the case assembly 100 includes: the first case body 10 and the second case body 20. The first case body 10 is arranged above the second case body 20, the first case body 10 opens downward, and the second case body 20 opens upward and is detachably connected to the first case body 10 to define the accommodation space. The first case body 10 includes: the bottom plate 13 and the two side plates connected to the two sides of the bottom plate 13. The second case body 20 includes: the bottom plate 13 and the two side plates connected to the two sides of the bottom plate 13. Lower surfaces of the two side plates of the first case body 10 are both provided with the sliding rails 14, upper surfaces of the two side plates of the second case body 20 are both provided with the sliding grooves 22, and the two sliding rails 14 fit into the two sliding grooves 22 in a one-to-one correspondence.

The end plate 30 is connected between a back end of the first case body 10 and a back end of the second case body 20. A shape of the end plate 30 is similar to that of a section of the accommodation space, but a sectional area of the end plate 30 is slightly greater than a sectional area of the accommodation space. The two ends of the end plate 30 are connected at the junctions of the side plates and the bottom plate 13 by using screws, and the limiting member 16 screwed into the sliding groove 22 is screwed into the sliding groove 22 through the end plate 30.

As shown in FIG. 9, a server S according to an embodiment of a second aspect of the present application includes a case assembly 100 described in the foregoing embodiment and a hash board. The server S further includes a circuit board assembly, a fan assembly 200, etc. The circuit board assembly is provided in the accommodation space, the fan assembly 200 is mounted on the front side or the back side of the case assembly 100, the hash board is arranged in the accommodation space, and at least two hash chips connected in series are arranged on the hash board.

According to the server S in this embodiment of the present application, the case assembly 100 in the foregoing embodiment is used, so that a difficulty and production costs of a machining process of the server can be reduced, and the weight of the server can be reduced, making it convenient to use and transport the server.

Specifically, the case assembly 100 for the server S is divided into two, and a diagonal length of each of the first case body 10 and the second case body 20 is only 64% of that of an existing case body, which greatly reduces a tonnage of an extrusion processing machine (to 50% of a tonnage of the machine currently needed), reduces the difficulty and production costs of a production process of the case assembly 100, and improves delivery capacity. Moreover, blanks of the first case body 10 and the second case body 20 after the splitting are open profiles, which can be extruded with a die of a relatively simple structure and a relatively small extrusion force. This solves problems of an existing case with regard to a complicated planar divergent die structure, a large extrusion force, an easily fractured die bridge, and a short service life of the die. Furthermore, the sections of the first case body 10 and the second case body 20 after the splitting have relatively small dimensions, which can reduce costs of a die; and a relatively small wall thickness can be used for extrusion, which helps reduce materials required for the case assembly 100.

Other configurations and operations of the server S according to this embodiment of the present application are known to those of ordinary skill in the art, and details are not described herein.

In the description of the present application, a "first feature" and a "second feature" may include one or more features. In the description of the present application, "a plurality of" means two or more. In the description of the present application, the first feature being "above" or "below" the second feature may include the first and second features being in direct contact, or may include the first and second features being not in direct contact but coming into contact through another feature between them. In the description of the present application, the first feature being "above", "over", and "on" the second feature includes the first feature being directly above and obliquely above the second feature, or simply means that the level of the first feature is higher than that of the second feature.

In the description of the specification, the description with reference to terms such as "an embodiment", "some embodiments", "a schematic embodiment", "an example", "a specific example", or "some examples" means that specific features, structures, materials, or characteristics described in combination with the embodiments or examples are included in at least one embodiment or example of the present application. In this specification, the schematic expressions of the above terms do not necessarily refer to the same embodiments or examples.

Although the embodiments of the present application have been shown and described, those of ordinary skill in the art can understand that various changes, modifications, substitutions, and variations can be made to these embodiments without departing from the principles and spirit of the present application. The scope of the present application is defined by the claims and equivalents thereof

What is claimed is:

1. A case assembly for a server, wherein in a first direction, a second direction, and a third direction that are perpendicular to each other, a dimension of the case assembly in the first direction is greater than a dimension of the case assembly in the second direction and greater than a dimension of the case assembly in the third direction; and
    the case assembly is divided into a first case body and a second case body in the first direction, both a side of the first case body that faces the second case body and a side of the second case body that faces the first case body are open, and the first case body and the second case body are detachably connected and jointly define an accommodation space,
    wherein the dimension of the case assembly in the second direction is greater than the dimension of the case in the third direction, one of the first case body and the second case body has a sliding rail extending in the second direction, the other of the first case body and the second case body is provided with a sliding groove that cooperates with the sliding rail, and an end portion of the sliding groove is provided with internal threads.

2. The case assembly for a server according to claim 1, wherein the sliding rail comprises:
    a connecting portion, with one side of the connecting portion connected to the one of the first case body and the second case body and extending in the second direction; and
    a limiting portion, connected to the other side of the connecting portion and extending in the second direction, with a maximum width of the limiting portion in the third direction greater than a maximum width of the connecting portion in the third direction.

3. The case assembly for a server according to claim 2, wherein a cross section of the limiting portion is formed with a shape of a circle, an ellipse, or a polygon.

4. The case assembly for a server according to claim 1, wherein an edge of the first case body that is adjacent to the second case body is formed with a first reinforcing portion, the first reinforcing portion is located on an outer surface of a side wall of the first case body in the third direction, a thickness of the first reinforcing portion is greater than a wall thickness of the first case body, and one of the sliding rail and the sliding groove is provided on the first reinforcing portion; and/or
    an edge of the second case body that is adjacent to the first case body is formed with a second reinforcing portion, the second reinforcing portion is located on an outer surface of a side wall of the second case body in the third direction, a thickness of the second reinforcing portion is greater than a wall thickness of the second case body, and the other of the sliding rail and the sliding groove is provided on the second reinforcing portion.

5. The case assembly for a server according to claim 1, further comprising:
    at least one limiting member, wherein a length of the sliding rail is less than a length of the sliding groove, and the limiting member is inserted into the end portion of the sliding groove and abuts against an end face of the sliding rail.

6. The case assembly for a server according to claim 5, wherein the limiting member is provided with external threads that cooperate with the internal threads.

7. The case assembly for a server according to claim 1, wherein a diagonal length of a section of the first case body that is perpendicular to the second direction is L1, a diagonal length of a section of the second case body that is perpendicular to the second direction is L2, L1<280 mm, and L2<280 mm.

8. The case assembly for a server according to claim 7, wherein L1<220 mm and L2<220 mm.

9. The case assembly for a server according to claim 1, wherein each of the first case body and the second case body comprises:
   a bottom plate; and
   two side plates, wherein the two side plates are connected to edges on two sides of the bottom plate in a one-to-one correspondence, the side plates are arranged perpendicular to the bottom plate, and the two side plates cooperate with the bottom plate to define a part of the accommodation space.

10. The case assembly for a server according to claim 9, further comprising:
   at least one end plate, wherein the at least one end plate seals at least one side of the accommodation space in the second direction, and the end plate is connected to the first case body and the second case body.

11. The case assembly for a server according to claim 10, wherein the periphery of the end plate is formed with bent edges that bend toward the first case body and the second case body, one part of the bent edges abuts against an outer wall surface of the first case body, and the other part of the bent edges abuts against an outer wall surface of the second case body.

* * * * *